United States Patent
Kodama

(10) Patent No.: US 6,646,938 B2
(45) Date of Patent: Nov. 11, 2003

(54) STATIC MEMORY HAVING SELF-TIMING CIRCUIT

(75) Inventor: Tsuyoshi Kodama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/102,703

(22) Filed: Mar. 22, 2002

(65) Prior Publication Data

US 2003/0021144 A1 Jan. 30, 2003

(30) Foreign Application Priority Data

Jul. 25, 2001 (JP) ........................................ 2001-224922

(51) Int. Cl.$^7$ ................................................. G11C 7/02
(52) U.S. Cl. ........................ 365/210; 365/154; 365/233
(58) Field of Search ............................... 365/210, 233, 365/194, 154, 230.06, 200

(56) References Cited

U.S. PATENT DOCUMENTS

| | | | |
|---|---|---|---|
| 5,268,869 A | 12/1993 | Ferris et al. ................. | 365/210 |
| 5,471,428 A * | 11/1995 | Baroni et al. ................. | 365/201 |
| 5,596,539 A | 1/1997 | Passow et al. ............... | 365/210 |
| 5,703,821 A * | 12/1997 | Baroni et al. ................. | 365/210 |
| 5,999,482 A * | 12/1999 | Kornachuk et al. ......... | 365/233 |
| 6,181,626 B1 * | 1/2001 | Brown ......................... | 365/210 |

* cited by examiner

*Primary Examiner*—Huan Hoang
*Assistant Examiner*—Gene N. Auduong
(74) *Attorney, Agent, or Firm*—Arent Fox Kintner Plotkin & Kahn, PLLC

(57) ABSTRACT

A static memory including a memory cell array having word lines, bit line pairs, and memory cells, each having a pair of nodes holding opposite levels; includes a dummy circuit disposed along the memory cell array, having a dummy word line, a dummy bit line pair, a self-timing dummy memory cell connected to the dummy word and bit lines and having a pair of nodes holding opposite levels, and load dummy memory cells connected to the dummy bit line pair; and a timing control circuit for detecting a voltage change of the dummy bit line pair to generate a start signal to a sense amplifier. The pair of nodes of the self-timing dummy memory cell are fixed to a first status, and the pair of nodes of the load dummy memory cell are fixed to a second status opposite to first status.

8 Claims, 10 Drawing Sheets

EMBODIMENT

STATIC MEMORY HAVING SELF-TIMING CIRCUIT

BACKGROUND OF THE INVENTION

1. Field of the Invention

The present invention relates generally to a static memory having a self-timing circuit for generating timing control signals such as starting signals for a sense amplifier, and more particularly to a static memory which prevents occurrence of a malfunction caused by a leak current of a cell transistor.

2. Description of the Related Art

A static memory has memory cells each of which is a pair of cross-connected inverters. The pair of inverters of the memory cells is connected to a bit line pair via a pair of transfer transistors, and the transfer transistors are conductive according to a driving of a word line, and the inverter pair of the memory cell is connected to the bit line pair, and the inverter pair drives the bit line pair. A voltage difference of the driven bit line pair is detected and amplified by a sense amplifier. Accordingly, a start timing of the sense amplifier is designed so as to come after the voltages of the bit line pair are sufficiently opened.

In a clock synchronous static memory, a timing control signal for starting the sense amplifier is generated after a certain delay time from a supply of a clock, and further in a clock asynchronous static memory, the timing control signal for starting the sense amplifier is generated after a certain delay time from a change of an address.

Preferably, the sense amplifier starting signal is generated at the shortest timing after a predetermined voltage difference is generated between the bit line pair, thereby reducing an access time. However, the bit line drive capability of the memory cells depends on a characteristic of cell transistors, and the characteristic of the cell transistors various due to variances of a manufacturing process. In this manner, as a time for which a predetermined voltage difference is generated between the bit line pair depends on the variances of the process, a sufficient timing margin is provided to generate the sense amplifier starting signal. Even if the timing when the predetermined voltage difference is generated between a bit line pair delays due to the variances towards lower drive capability in the cell transistors, this timing margin allows to prevent a detection of erroneous data by early starting the sense amplifier.

The timing margin of the sense amplifier starting signal prolongs the access time of the memory, and impairs the high-speed performance as the characteristic of the static memory. As a method for solving this problem, a dummy circuit comprising a word line, a memory cell and a bit line is provided, and the sense amplifier starting signal is generated by utilizing a self-timing circuit including this dummy circuit.

FIG. 1 is a configuration diagram of a static memory having a conventional self-timing circuit. In this example, an address Add and a control signal Cont are input in synchronism with a clock CK, and a timing control circuit and a decoder circuit 10 generate timing control signals φWA, φSE, a word line selecting signal RS and a column selecting signal CS. A word line driver 12 drives a word line WL according to the word line selecting signal RS generated by the decoder circuit to select a memory cell MC within a memory cell array MCA. The selected memory cell MC drives a bit line pair BL, XBL, and a voltage of the bit line pair selected by a column switch 14 is amplified by a sense amplifier 18. A data output Dout is output from an output circuit 22. The above is a readout operation. In a write operation, a data input Din is input into an input circuit 20, and the selected memory cell MC is driven by a write amplifier 16, so that data is written.

In the readout operation, a timing of a starting signal φSA for starting the sense amplifier 18 is controlled by the self-timing circuit comprising a dummy word line DWL, a self-timing dummy memory cell SDMC, a dummy bit line pair DBL, XDBL and a dummy timing control circuit 24. The dummy word line DWL having a plurality of load dummy cells LDMC, a self-timing dummy memory cell SDMC and a dummy bit line pair DBL, XDBL having the plurality of load dummy cells LDMC are provided with a configuration equivalent to a normal memory cell array.

FIG. 2 is a timing chart diagram of a readout operation of FIG. 1. In the readout operation, in a status that the bit line pair BL, XBL is pre-charged at H level, the word line driver 12 drives the selected word line WL as well as the dummy word line DWL. A self-timing dummy memory cell SDMC is selected in response thereto to drive the dummy bit line pair DBL, XDBL. Specifically, a potential level of one dummy bit line is decreased from the pre-charge level. A change ΔV of the voltage of this dummy bit line pair is detected, and a dummy timing control circuit 24 generates a self-timing signal φSLF. The timing control circuit 10 generates the sense amplifier starting signal φSA in response to this self-timing signal φSLF.

On the other hand, the memory cell MC selected by driving of the selected word line WL drives the bit line pair BL, XBL. In response to the sense amplifier starting signal φSA, the sense amplifier 18 detects the voltage difference ΔV of the selected bit line pair to drive one of the bit line pair down to sufficiently low level.

According to the dummy circuit, drive capability of the memory cell MC in the memory array varies due to process variances, but drive capability of the dummy memory cell SDMC similarly varies. Accordingly, a timing when a voltage difference to be detected by the sense amplifier occurs in the bit line pair BL, XBL driven by the memory cell MC and a timing when a predetermined voltage difference occurs in the dummy bit line pair DBL, XDBL driven by the dummy memory cell SDMC vary in the same direction according to the process variances. As a result, the sense amplifier starting signal φSA is always generated at an optimal timing.

Incidentally, in FIG. 2, a reduction in a voltage of the dummy bit line pair DBL, XDBL is faster than a normal bit line pair BL, XBL. This is because the self-timing dummy memory cell SDMC is configured by connecting a plurality of memory cells in parallel, so as to have a higher drive capability than a piece of memory cell. Thus, a voltage change of the dummy line pair is made faster than the normal bit line pair, thereby making it possible to generate a self-timing signal φSLF at an early timing.

FIG. 3 is a detailed circuit diagram of the dummy bit line pair and the dummy memory cell connected thereto in the prior art. The self-timing dummy memory cell SDMC has a latch circuit in which a pair of inverters INV1, 2 are cross-connected to each other, and transfer transistors N5, N6 for connecting then to the bit line pair DBL, XDBL. A plurality of the dummy memory cells SDMC (not shown) are connected in parallel to the dummy word line DWL. Furthermore, load dummy memory cells LDMC1, 2 also have the pair of inverters INV1, 2 and the transfer transistors N5, N6, similarly. However, word lines LDWL1, 2 connected thereto are fixed to a ground potential Vss. Accordingly, the load dummy memory cells are provided only for giving the same parasitic capacitance as the normal memory cell to the dummy bit line pair DBL, XDBL, and does not drive the dummy bit line pair.

As the plurality of self-timing dummy memory cells SDMC are provided in parallel, one of a pair of nodes n1, n2 of an inverter pair is fixed to a potential at H level or L level so that a conflict does not generate in operations of driving the dummy bit line pair when the dummy word line DWL is driven. In an example of FIG. 3, the node n1 is connected to a power supply Vcc. As a result, according to the driving of the dummy word line DWL, a right-side dummy bit line XDBL among the dummy bit line pair which has been pre-charged in advance is driven to L level side by the inverter INV1 via the transfer transistor N6. In other words, the dummy bit line XDBL is driven according to an illustrated discharge current I0. Behavior of this dummy bit line is fixed.

However, the load dummy memory cells LDMC1, 2 not relating to the driving of the dummy bit line are configured in the same manner as the normal memory cell, and the pair of nodes n1, n2 are set to H or L level when the power supply on. A status of the load dummy memory cells LDMC1, 2 is unspecified differing from the self-timing dummy memory cell SDMC.

The self-timing dummy memory cells SDMC and the load dummy memory cells LDMC are provided in the same number as the memory cells of the memory cell array. The self-timing dummy memory cells SDMC are configured only by connecting at most approximately 4 pieces to 8 pieces of cell in parallel, and the remaining many cells are the load dummy memory cells.

Now, assuming that all the load dummy memory cells LDMC come to a status that the node n1 is in H level and the node n2 is in L level. Although the transfer transistors N6 are in a nonconductive state, the transistors N6 flow a certain leak current. In particular, according to a trend of a low threshold voltage of a semiconductor memory in late years, the leak current of transistors increases. As a result, a leak current I1 flows from the right-side dummy bit line XDBL of the dummy bit line pair. The leak current per se is an extremely small current, but as the number of load dummy memory cells is many, when totalizing them, the total becomes a relatively large current.

For this reason, as shown in the timing chart diagram of FIG. 4, the right-side dummy bit line XDBL is also driven from the pre-charge level to the L level by the leak current I1 in addition to the drive current I0 of the self-timing dummy memory cells SDMC. The drive speed is faster than as shown in FIG. 2. For this reason, a timing when a predetermined potential difference ΔV is generated in the dummy bit line pair is made faster, and a rising timing of the self-timing signal φSLF is made faster, and finally a timing of the sense amplifier starting signal φSA is also made faster. The timing shown by a broken line of FIG. 4 is an optimal timing of the sense amplifier starting signal φSA, but an early timing is generated as shown by a solid line. As a result, when the sense amplifier 18 is activated while a sufficient potential difference does not generate in the bit line pair BL, XBL, there is a possibility that the erroneous readout data are output from the sense amplifier. Namely, a malfunction occurs due to the leak current.

SUMMARY OF THE INVENTION

It is therefore an object of the present invention to provide a static memory which prevents occurrence of the malfunction.

Another object of the present invention is to provide a static memory which prevents a malfunction from occurring due to a fact that a self-timing circuit configured by dummy cells makes a timing of a sense amplifier starting signal too fast.

In order to achieve the above objects, according to an aspect of the present invention there is provided a static memory including a memory cell array having a plurality of word lines, a plurality of bit line pairs, and memory cells, disposed at cross sections thereof, each having a pair of nodes which hold opposite levels; the static memory comprising a dummy circuit disposed along the memory cell array, having a dummy word line, a dummy bit line pair, a self-timing dummy memory cell which are connected to the dummy word line and dummy bit line pair and have a pair of nodes holding opposite levels, and a plurality of load dummy memory cells connected to the dummy bit line pair; and a timing control circuit for detecting a voltage change of the dummy bit line pair to generate a timing control signal, i. g. a start signal to a sense amplifier for amplifying the bit line pair. The pair of nodes of the self-timing dummy memory cell are fixed to a first status, and the pair of nodes of the load dummy memory cell are fixed to a second status opposite to the first status.

According to the present invention, when the dummy bit line pair is driven by the self-timing dummy memory cell in which the pair of nodes are fixed to the first status, as the load dummy memory cell is fixed to a different status from the self-timing dummy memory cell, this prevents from making the driving of the dummy bit line pair excessively early due to the leak current of the load dummy memory cell unlike the prior art. As a result, it is possible to generate the sense amplifier starting signal after a generation of the sufficient voltage difference in the bit line pair. Moreover, it is possible to generate the sense amplifier starting signal at the optical timing corresponding to the characteristic variances of the cell transistors due to a manufacturing process or the like.

In the preferred embodiment of the present invention, one of the pair of nodes of the self-timing dummy memory cell is fixed to the first voltage level. On the other hand, one of the pair of nodes of the load dummy memory cell is fixed to the second voltage level opposite to the first voltage level, or another node is fixed to the first voltage level. The first and second voltage levels are a power supply level or a ground level, for example.

In the preferred embodiment of the present invention, all the plurality of load dummy memory cells are fixed to the opposite status to the self-timing dummy memory cell. As a result, all the load dummy memory cells always maintain the opposite status to the self-timing dummy memory cell, and the leak current prevents the driving of the dummy bit line pair from being made faster, and can prevent the malfunction.

In another preferred embodiment, at least some of the plurality of load dummy memory cells may be fixed to the opposite status to the self-timing dummy memory cell. As a result, it is prevented that all the load dummy memory cells hold the same status as the self-timing dummy memory cell, and the malfunction occurs due to a fact that the driving of the dummy bit line pair is excessively made faster by the leak current. Namely, it is possible to prevent a worst status.

Furthermore, in a further embodiment, some of the plurality of load dummy memory cells are fixed to the opposite status to the self-timing dummy memory cell, and the residue are fixed to the same status. By doing so, as it is possible to always set the behavior of the leak current due to the load dummy memory cell in the same status, this can prevent such a fact that a driving operation of the dummy bit line pair fluctuates by an indefinite status of the load dummy memory cell to contain a possibility of causing the malfunction. Moreover, it is possible to prevent a worst status.

According to a second aspect of the present invention, the load dummy memory cells are initially set to the opposite status to the status of the self-timing dummy memory cell. Namely, instead of fixing one node or another node of the load dummy memory cells to a predetermined voltage level to fix them to the opposite status to the self-timing dummy memory cell, according to the second aspect, the load dummy memory cell is set to the opposite status to the status of the self-timing dummy memory cell and holds such status when the memory is initially set. For this reason, a reset operation of the load dummy memory cell is carried out when performing the initial setting. As the load dummy memory cell is not driven by the word line, when the status has once been set, the status is maintained until the power supply is turned off.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Preferred embodiments of the present invention will now be described with reference to the accompanying drawings. It is to be understood however that the scope of protection of the present invention is not limited to the embodiments below but covers the invention defined by claims and its equivalents.

Figure 1:
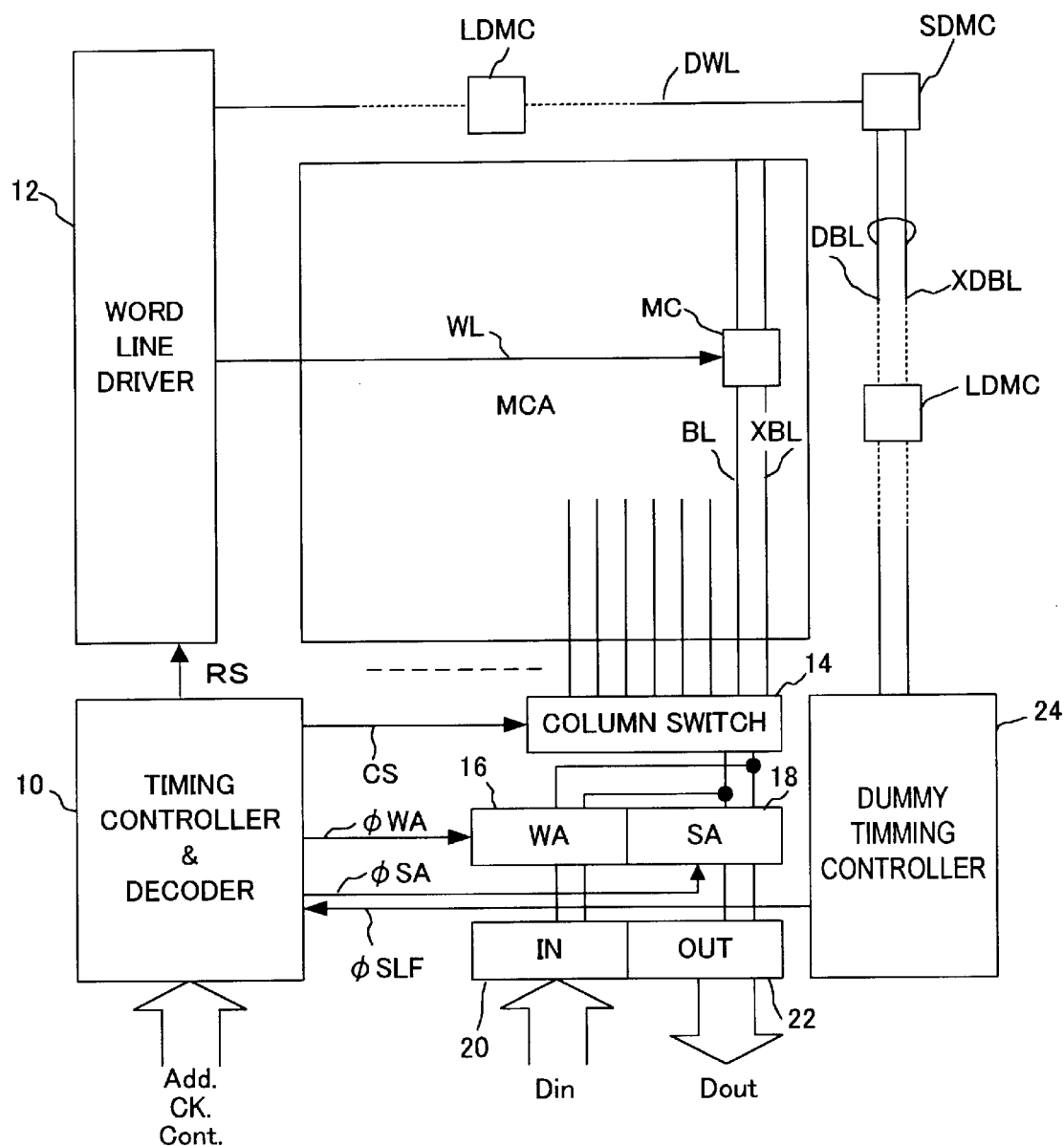
FIG. 1 is a configuration diagram of a static memory having a conventional self-timing circuit.
Figure 2:
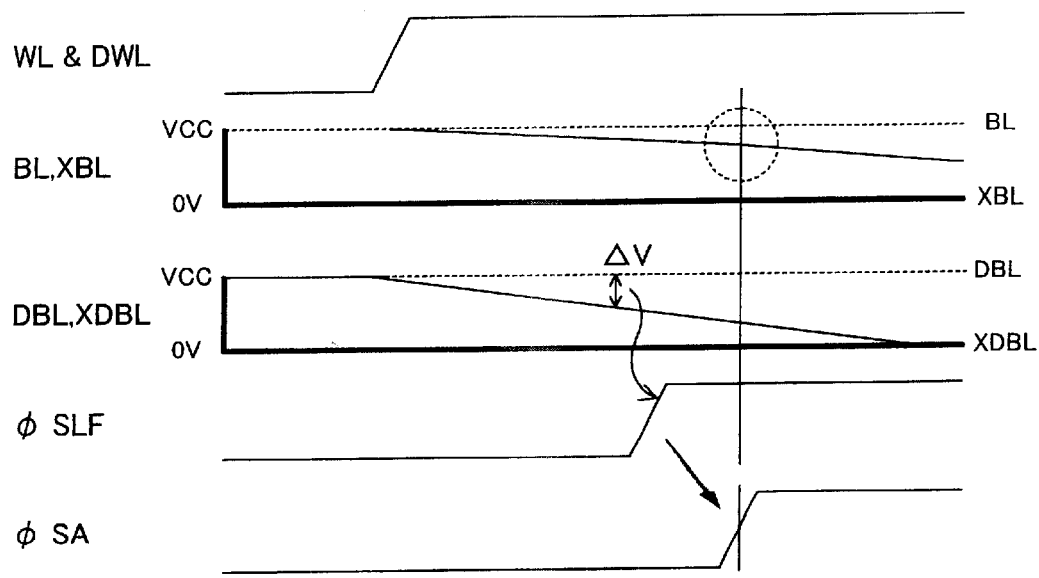
FIG. 2 is a timing chart diagram of a readout operation of FIG. 1.
Figure 3:
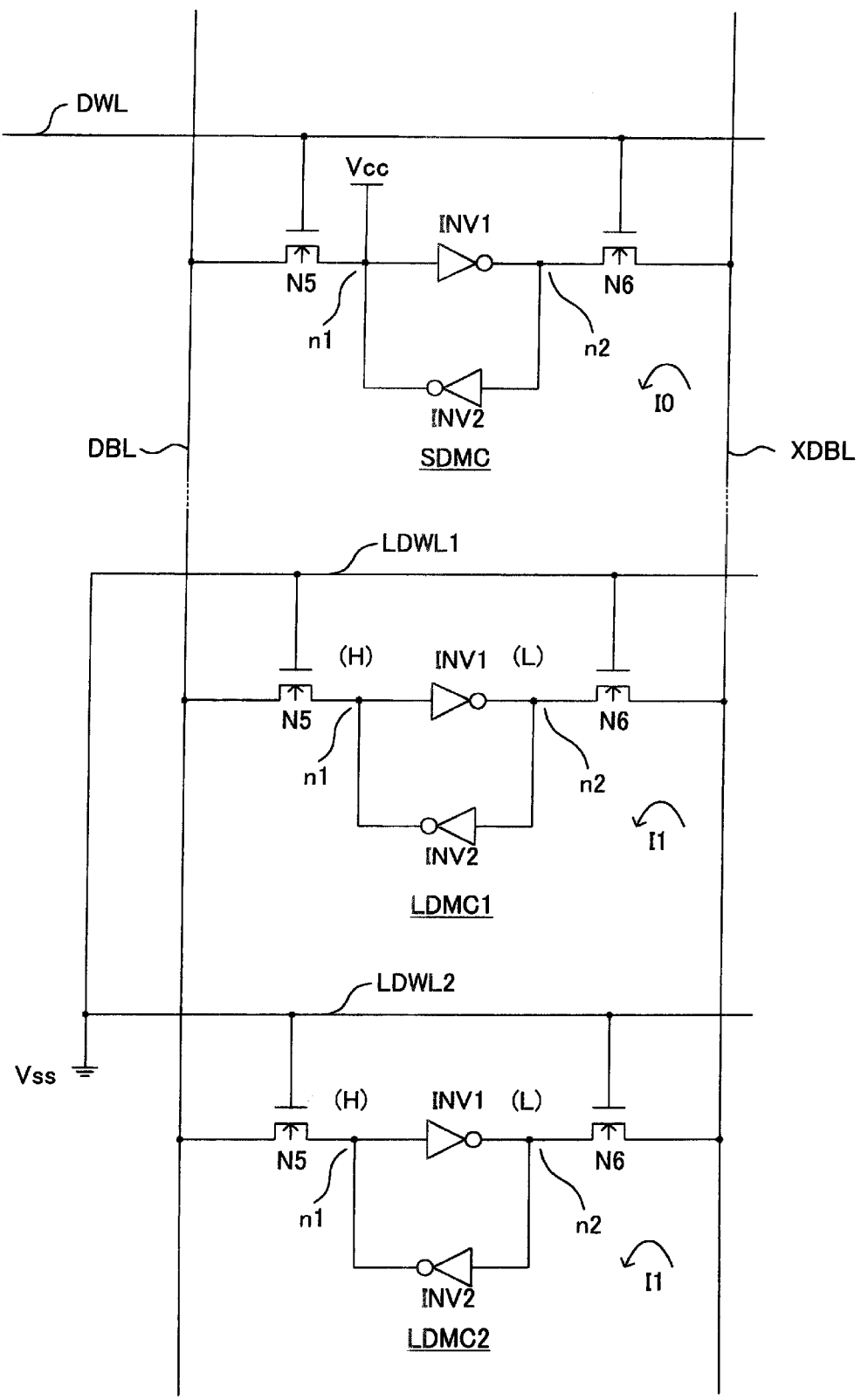
FIG. 3 is a detailed circuit diagram of a dummy bit line pair and a dummy memory cell connected thereto in the prior art.
Figure 4:
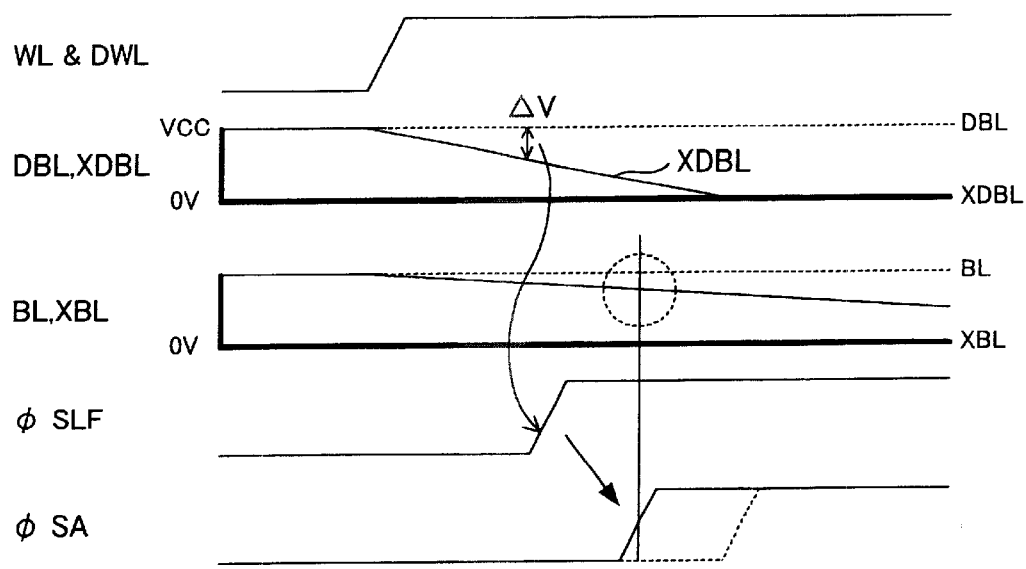
FIG. 4 is a timing chart diagram showing a malfunction of a readout.
Figure 5:
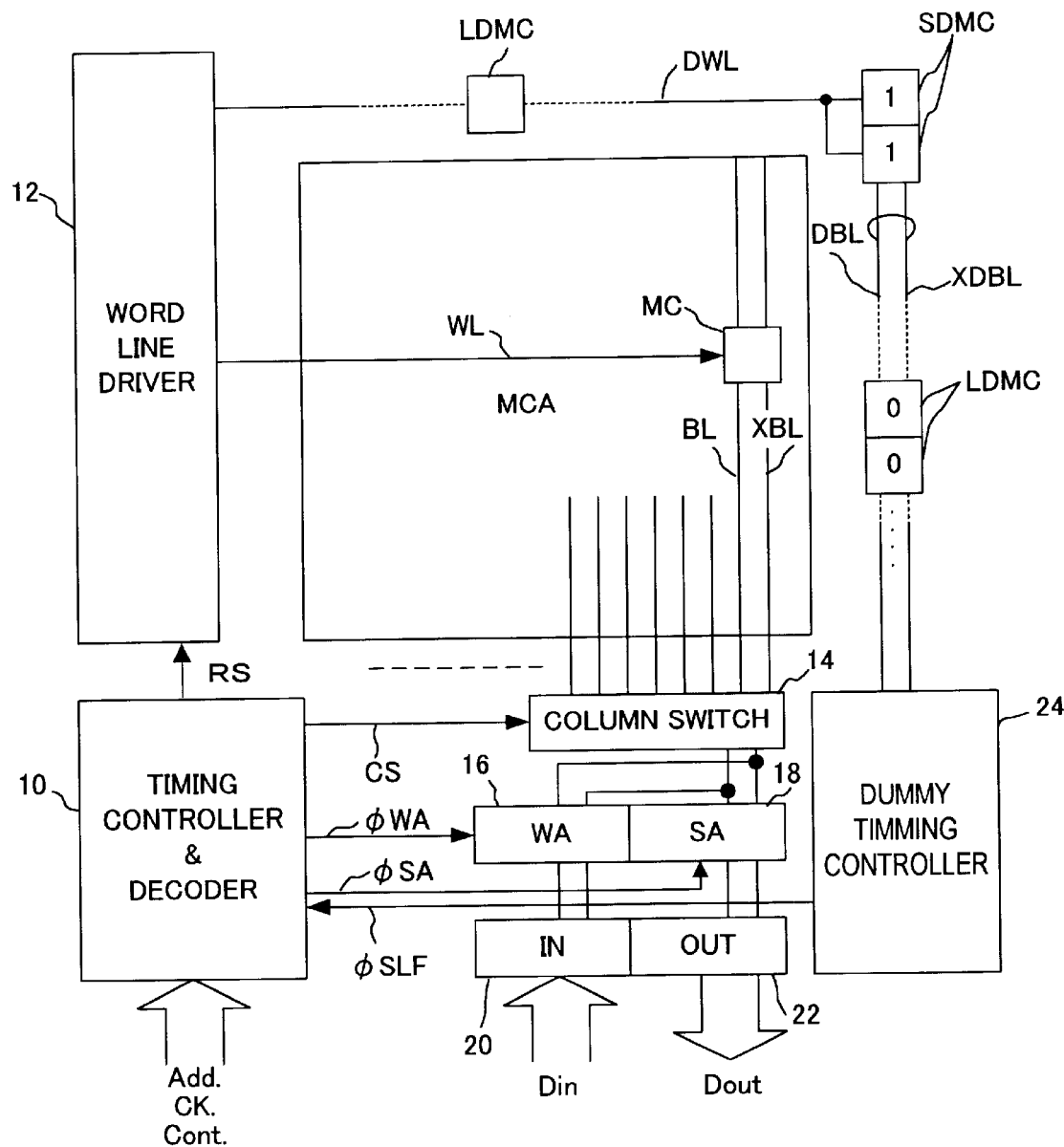
FIG. 5 is a configuration diagram of a memory according to this embodiment.

FIG. 5 is a configuration diagram of a memory according to this embodiment. In FIG. 5, similarly to FIG. 1, a memory cell array MCA having a plurality of word lines WL, a plurality of bit line pairs BL, XBL, and a plurality of memory cells MC stationed in the crossing positions is provided. The word line WL selected by a word line driver 12 is driven, and the memory cell MC drives the bit line pairs BL, XBL, and a voltage difference generated in the bit line pair is detected and amplified by a sense amplifier 18. Furthermore, the bit line pair is driven by a write amplifier 16 when writing, and data is written into the selected memory cell.

A sense amplifier starting signal φSA for controlling a start timing of the sense amplifier 18 is controlled by a dummy circuit and a dummy timing control circuit 24. That is, next to the memory cell array MCA, the dummy circuit comprising a dummy word line DWL, a self-timing dummy memory cell SDMC and a dummy bit line pair DBL, XDBL is provided. A plurality of load dummy memory cells LDMC are provided in the dummy word line DWL and the dummy bit line pair DBL, XDBL, so that load capacitances each equivalent to a word line WL and a bit line pair DL, XBL in a memory cell array is imparted thereto. For example, the memory cell array are given to a row direction and to a column direction, so that these dummy circuits can be provided.

As shown in FIG. 5, in order to increase a drive capability more than a normal memory cell MC, a plurality of self-timing dummy memory cells SDMC are connected in parallel to the dummy bit line pair DBL, XDBL. Inside statuses of the self-timing dummy memory cells SDMC are all fixed to a first status "1." As the plurality of self-timing dummy memory cells SDMC are simultaneously selected, fixing these cells to the same status prevents a conflict from generating in a drive operation of the dummy bit line pair DBL, XDBL.

On the contrary, at least some or all of the plurality of load dummy memory cells LDMC connected to the dummy bit line pair are fixed to the opposite status "0" to the self-timing dummy memory cells SDMC. For example, when the memory cell array MCA has 512 word lines, 513 dummy memory cells are provided in the dummy bit line pair. When 4 or 6 dummy memory cells are connected to the dummy word line DWL as the self-timing dummy memory cell, the remaining 509 or 506 dummy memory cells become the load dummy memory cells.

All of the load dummy memory cells LDMC are fixed to the opposite status to the self-timing dummy memory cells SDMC, so that the drive speed of the dummy bit line pair by the self-timing dummy memory cells is prevented from making faster by a leak current of the load dummy memory cells. However, all the load dummy memory cells are not necessarily required to fix to the opposite status to the self-timing dummy memory cell, and for example, most of the load dummy memory cells may be fixed to the opposite status and the residue may be fixed to the same status. Alternatively, half the load dummy memory cells may be fixed to the opposite status and the residual half may be fixed to the same status. Leastwise, at least, it is necessary to prevent a worst status that all the load dummy memory cells become in the same status as the self-timing dummy memory cell.

Figure 6:
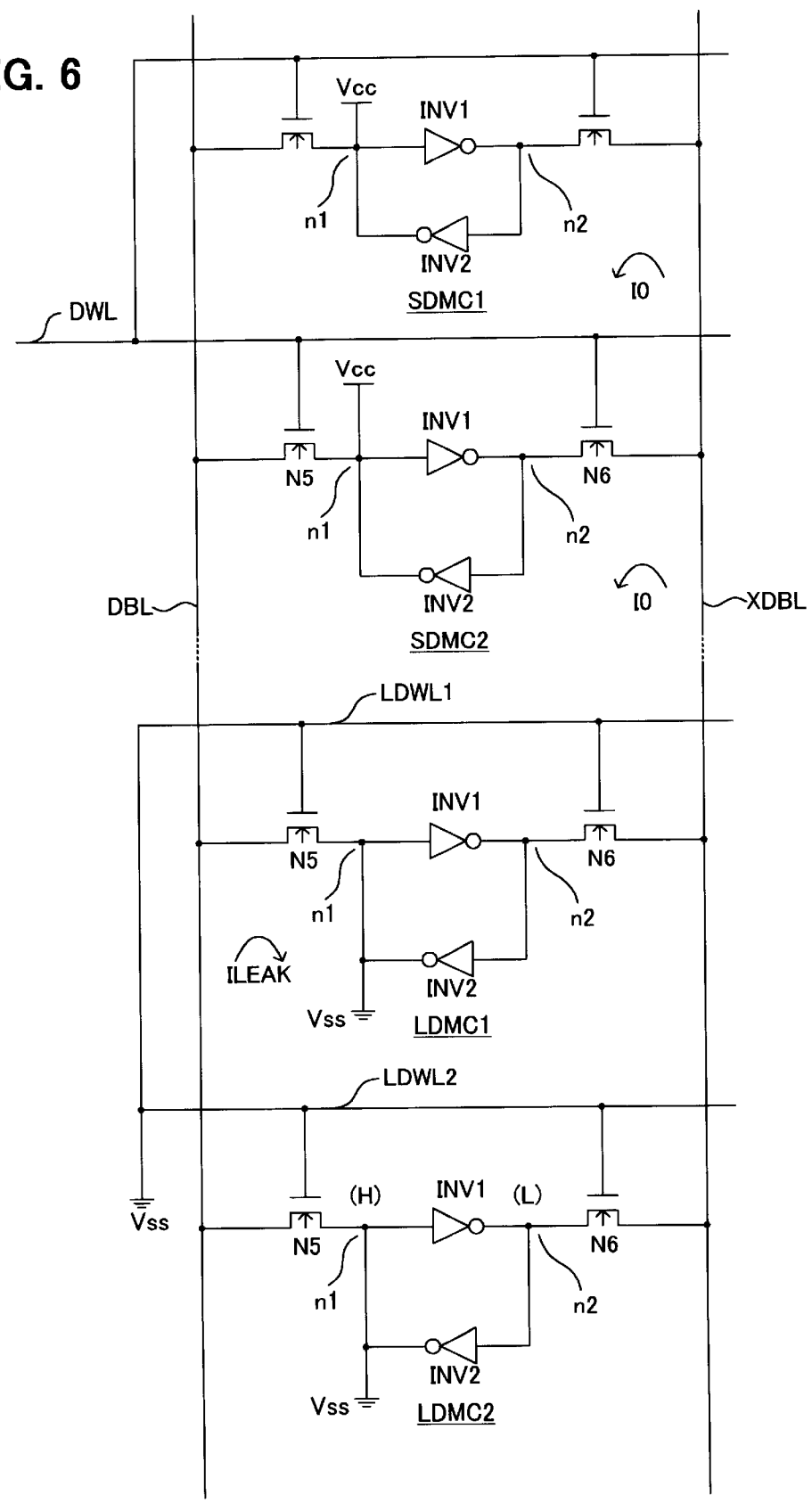
FIG. 6 is a detailed circuit diagram of the dummy bit line pair and the dummy memory cell according to this embodiment.

FIG. 6 is a detailed circuit diagram of the dummy bit line pair and the dummy memory cell according to this embodiment. In FIG. 6, two self-timing dummy memory cells SDMC1, 2 and two load dummy memory cells LDMC1, 2 are shown. The two self-timing dummy memory cells SDMC1, 2 are connected in parallel to the dummy word line DWL, and when the dummy word line DWL is driven, the dummy bit line pair DBL, XDBL is simultaneously driven.

The dummy memory cell, similarly to a normal memory cell, has a latch circuit in which a pair of inverters INV1, 2 are cross-connected to each other, and transfer transistors N5, N6 connecting a pair of nodes n1, n2 to a dummy bit line, respectively. When the transfer transistors N5, N6 are conductive, the pair of inverters drive the dummy bit line pair.

In the two self-timing dummy memory cells SDMC1, 2, one node n1 of the pair of nodes is fixed to a power supply Vcc. Accordingly, when the dummy word line DWL is driven, the one dummy bit line XDBL is driven by the inverter INV1 so as to decrease to L level. In the case, the total drive current I0 by the plurality of self-timing dummy memory cells is more than the drive current of a piece of memory cell MC, and correspondingly the dummy bit lines are driven faster than the normal bit lines.

On the other hand, the one node n1 of the load dummy memory cells LDMC1, 2 are fixed to a ground Vss. Accordingly, the another node n2 is maintained at a power supply level Vcc. The word lines LDWL1, 2 with respect to the load dummy memory cells are fixed to ground level, and are not driven at H level. However, due to the leak current of the transfer transistor N5, a leak current $I_{leak}$ flows to the left-side dummy bit line DBL as shown in FIG. 6. However, in the right-side dummy bit line XDBL to be driven by the self-timing dummy memory cells SDMC1, 2, the leak current accelerating the driving is not generated.

Figure 7:
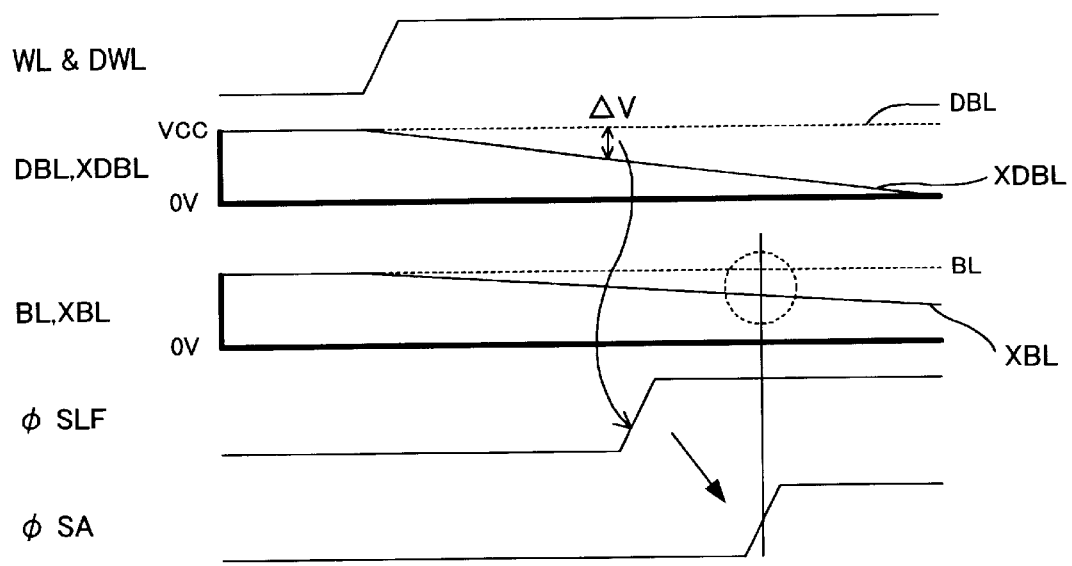
FIG. 7 is a timing chart diagram of a readout operation according to this embodiment.

FIG. 7 is a timing chart diagram of a readout operation according to this embodiment. Explaining the readout operation, when in a status that the bit line and dummy bit line pair are pre-charged to level of the power supply Vcc, an address Add and a control signal Cont are supplied in synchronism with a clock CK, the word line WL and dummy word line DWL selected by a decoder circuit 10 are driven by the word line driver 12. According to the driving of the word line WL, the memory cell MC drives one of the bit line pair BL, XBL to L level. Furthermore, according to the driving of the dummy word line DWL, the self-timing dummy memory cells SDMC1, 2 drive one XDBL of the dummy bit line pair to L level.

At this time, the plurality of load dummy memory cells LDMC1, 2 are connected to the dummy bit line pair and are fixed to a different status from the self-timing dummy memory cells SDMC1, 2. Accordingly, the leak current to generate via the transfer transistor N6 does not make faster the driving of the right-side dummy bit line XDBL. The leak current $I_{leak}$ of the load dummy memory cell generates in the left-side dummy bit line DBL, but as the node n1 of the self-timing dummy memory cells SDMC1, 2 is fixed to the power supply Vcc, the level of the dummy bit line DBL which is at pre-charge level is not lowered due to these leak currents $I_{leak}$. Accordingly, a timing when a voltage difference ΔV is generated in the dummy bit line pair DBL, XBDL almost depends on the drive capability of the self-timing dummy memory cells SDMC1, 2, and it is possible to generate a behavior in correspondence to variances of the drive capability of the memory cell due to variances of a manufacturing process in the dummy bit line pair.

As a result, as shown in FIG. 7, in response to a generation of the voltage difference ΔV of the dummy bit line pair, a dummy timing control circuit 24 generates a self-timing signal φSLF, and in response thereto, a timing control circuit 10 generates a sense amplifier starting signal φSA. As described above, the timing of the generation of the self-timing signal φSLF does not change depending on an inside status of the load dummy memory cell, but is always an optical timing depending on variances of the drive capability of the memory cell. Furthermore, the timing control circuit 10 also generates other timing control signals such as an equalize signal of the bit line pair, an output enable signal of a data output circuit, or the like (not shown) in response to the self-timing signal φSLF.

At least some of the load dummy memory cells LDMC may be fixed to the opposite status to the self-timing dummy memory cell SDMC. By doing so, at least a drive speed to the L level side of the dummy bit line XDBL is slower than a conventional worst state, and it is possible to avoid a malfunction by too early starting the sense amplifier. In the case, the remaining load dummy memory cells are fixed to either status, so that influences of the leak current of the load dummy memory cell are fixed.

Figure 8:
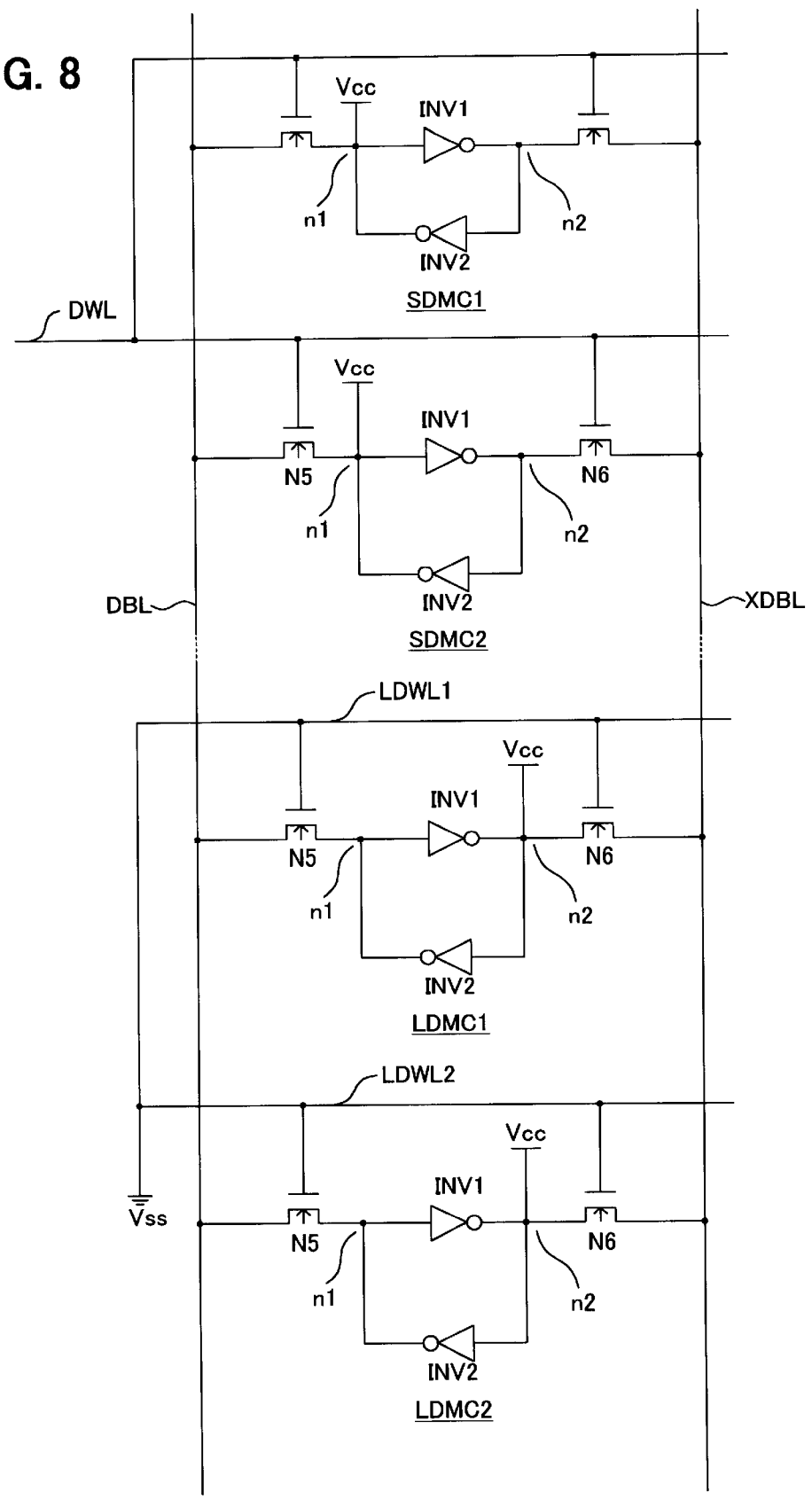
FIG. 8 is a detailed circuit diagram of another dummy bit line pair and dummy memory cell according to this embodiment.

FIG. 8 is a detailed circuit diagram of another dummy bit line pair and dummy memory cell according to this embodiment. In this example, the self-timing dummy memory cells SDMC1, 2 are same with FIG. 6, and the node n1 is fixed to the power supply Vcc. On the other hand, in the example of FIG. 8, the node n2 of the load dummy memory cells LDMC1, 2 is fixed to the power supply Vcc. Even in such a fixing method, the load dummy memory cells LDMC1, 2 can be fixed to a different status from a timing chart dummy memory cell.

Figure 9:
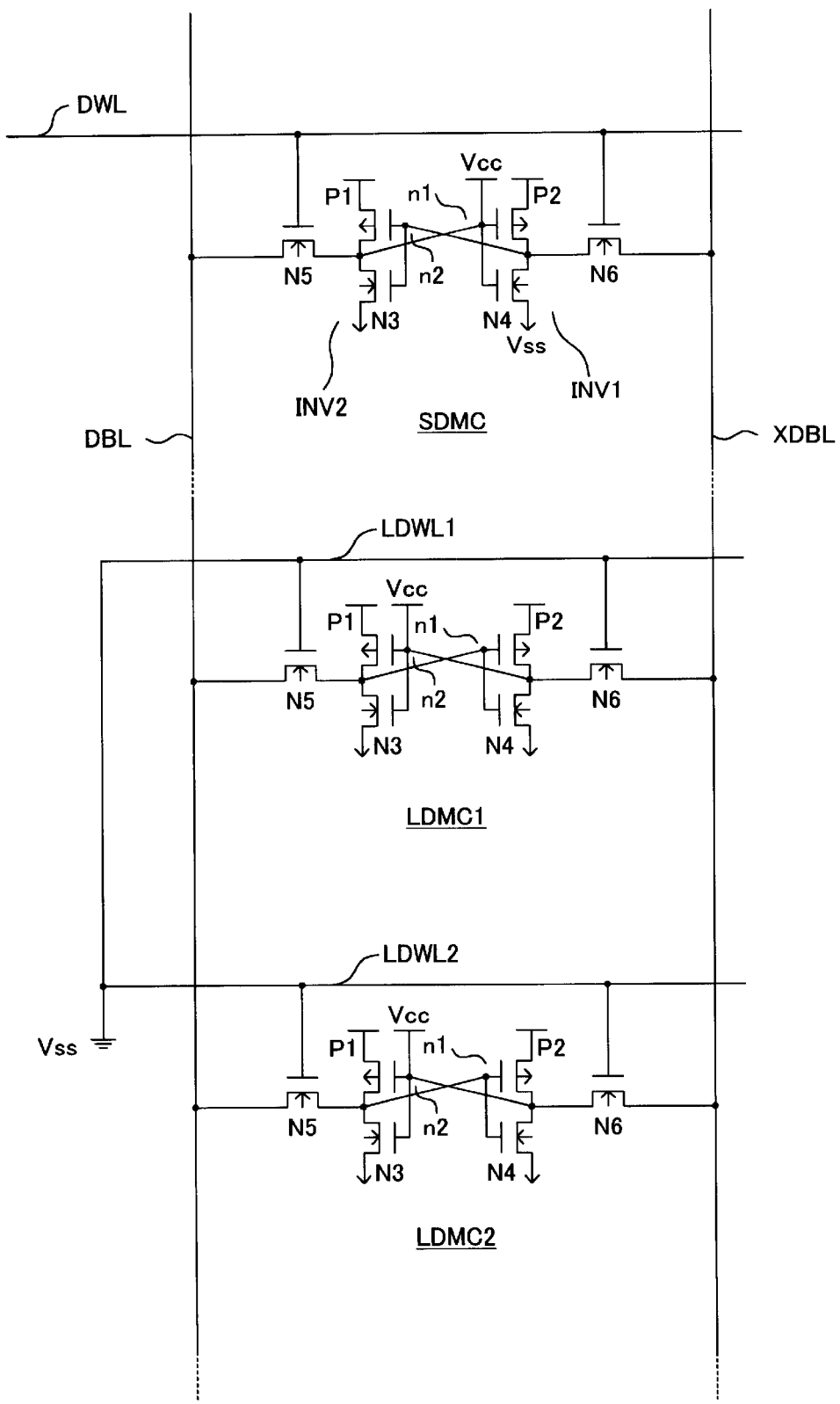
FIG. 9 is a detailed circuit diagram of FIG. 8.

FIG. 9 is a detailed circuit diagram of FIG. 8. In the dummy memory cell, the inverter INV2 is configured by a P channel transistor P1 and an N channel transistor N3, and the inverter INV1 is configured by transistors P2, N4, and the I/O nodes n1, n2 of the both are cross-connected to each other. In the self-timing dummy memory cell SDMC, the node n1 is connected to the power supply Vcc, to be fixed to the first status. On the other hand, in the load dummy memory cells LDMC1, 2, the node n2 is connected to the power supply Vcc, to be fixed to a second status opposite to the first status. When one of the pair of nodes is fixed to the power supply Vcc or the ground Vcc, the other node is automatically fixed to the opposite level thereto by an operation of the inverters.

Figure 10:
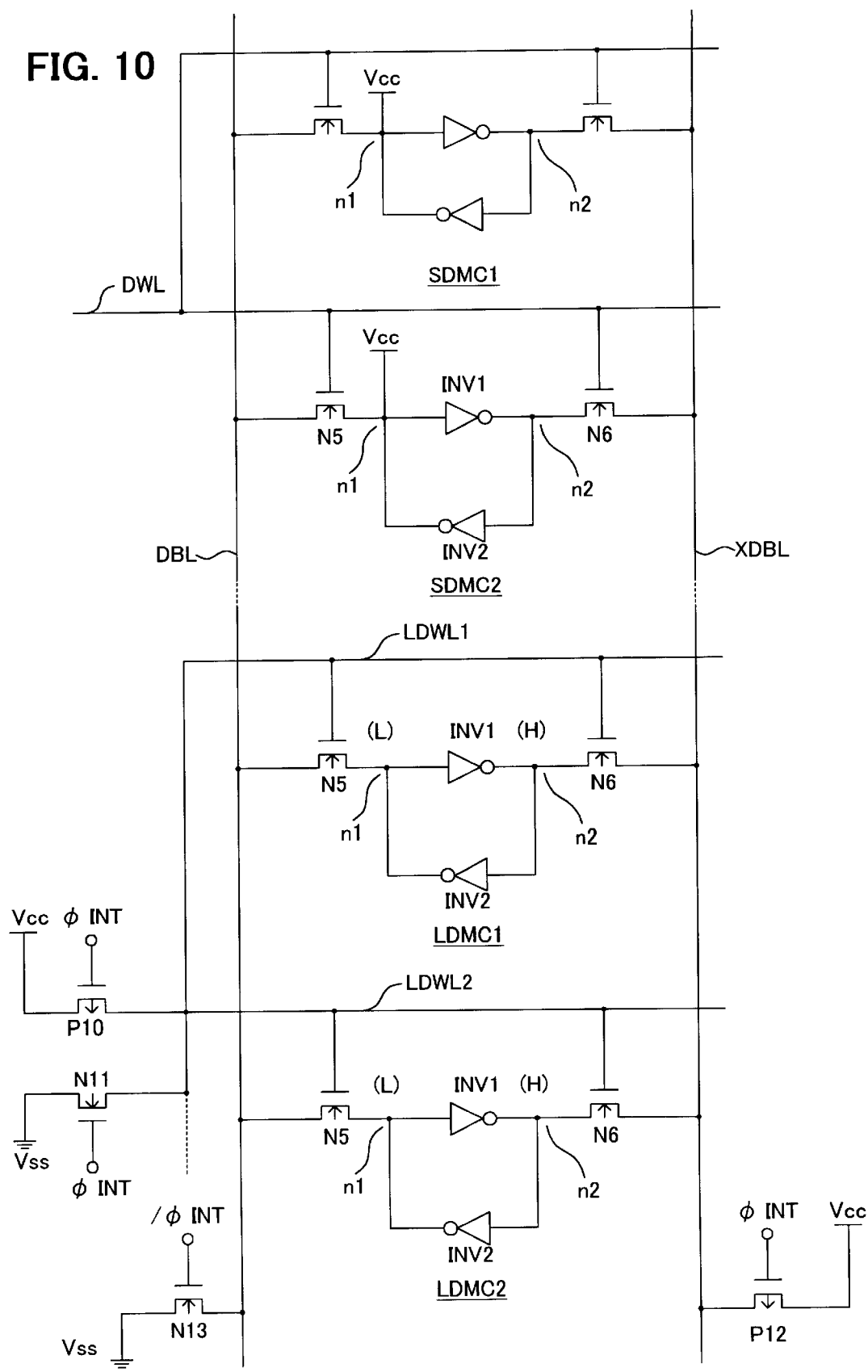
FIG. 10 is a circuit diagram of the dummy bit line pair and the dummy memory cell according to another embodiment.

FIG. 10 is a circuit diagram of the dummy bit line pair and the dummy memory cell according to another embodiment. In this example, in the self-timing dummy memory cells SDMC1, 2, the one node n1 is fixed to the power supply Vcc. On the other hand, in the load dummy memory cells LDMC1, 2, one of the nodes n1, n2 is not fixed to the power supply or the ground.

However, the dummy word lines LDWL1, 2 of the load dummy memory cell LDMC are connected to the power supply Vcc via a transistor P10, and to the ground Vss via a transistor N11. Furthermore, the right-side dummy bit line XDBL is connected to the power supply Vcc via a transistor P12, and the left-side DBL is connected to the ground Vss via a transistor N13. An initialization signal φINT which is set to the L level at initialization is applied to gates of the transistors P10, N11, P12, and its opposite signal /φINT is applied to the gate of the transistor N13.

Accordingly, the initialization signal φINT is set to L level at initialization when the power supply of the memory starts, and the dummy word lines LDWL1, 2 are driven to the power supply Vcc. As a result, the transfer transistors N5, N6 of the load dummy memory cells LDMC1, 2 are conductive. At the same time, the dummy bit line DBL is driven to the ground level Vss, and the dummy bit line XDBL is driven to the power supply level Vcc. That is, the transistors P12, N13 operate as a dummy write circuit for writing an initial status to the load dummy memory cells LDMC1, 2, and the nodes n2 of the loading dummy memory cells are set to H level, and the nodes n1 are driven to the L level, and the opposite status to the self-timing dummy memory cells SDMC1, 2 is written into the load dummy memory cell.

When the initialization is completed, the initialization signal φINT is set to the H level, and the dummy word lines LDWL1, 2 are fixed to the L level, and also the transistors P12, N13 are maintained to be nonconductive. As a result, the load dummy memory cell holds the above initialization status.

As described above, according to this embodiment, at the time of initializing the load dummy memory cell, the opposite status to the self-timing dummy memory cell is written and maintained. Accordingly, setting to the same status as in FIG. 6 at the time of a normal operation, the leak current due to the load dummy memory cell does not accelerate the driving of the dummy bit line by the self-timing dummy memory cell.

According to the above embodiments, the self-timing circuit for generating the sense amplifier starting signal at the optimal timing was explained by utilizing the dummy circuit having the dummy memory cells and the dummy bit line pair. However, the present invention is not limited to the embodiments, and the other timing control signals, for example, a bit line equalize signal, an equalize signal of a sense amplifier output, an output enable signal of an output latch circuit, or the like may be generated by utilizing the dummy circuit.

Furthermore, in FIG. 5, the dummy timing control signal 24 generates the self-timing signal φSLF, but can directly generate the sense amplifier starting signal φSA.

Furthermore, the above embodiments were explained exemplifying a clock synchronous static memory, but the present invention is also applicable to a clock asynchronous SRAM. In the case of the clock asynchronous SRAM, the clock is not supplied from externally, but an ATD circuit for detecting a change of address to be supplied from externally is provided, and at a timing when the ATD circuit detects a start of a new readout operation, an operation of an internal circuit starts and various timing signals in the internal circuit are generated. Accordingly, in FIG. 5, a detection circuit for detecting the change of address is provided in the timing control circuit/decoder circuit 10, and an output of the detection circuit has a function similar to the clock. Furthermore, in the case of a write operation, when a write enable signal as a control signal is activated and write data is input, the write operation starts. The other configuration of the self-timing circuit by the dummy circuit is same with the example of the clock synchronous type.

Hereinabove, according to the present invention, in the static memory configuring the self-timing circuit by the dummy circuit, it is possible to prevent the malfunction caused by the fact that the driving of the dummy bit line is excessively accelerated by the leak current of the dummy memory cell, with the timing of the control signal being too early.

What is claimed is:

1. A static memory comprising:
   a memory cell array having a plurality of word lines, a plurality of bit line pairs, and memory cells, disposed at cross sections thereof, each having a pair of nodes which hold opposite levels;
   a dummy circuit disposed along the memory cell array, having a dummy word line, a dummy bit line pair, a plurality of self-timing dummy memory cells which are connected to the dummy word line and dummy bit line pair and have a pair of nodes holding opposite levels, and a plurality of load dummy memory cells connected to the dummy bit line pair, wherein said plurality of self-timing dummy memory cells drives the bit line together in response to a selection of dummy word line; and
   a timing control circuit for detecting a voltage change of the dummy bit line pair to generate a timing control signal,
   wherein one of the pair of nodes of the self-timing dummy memory cells are connected to a higher level so as to be fixed to a first status, and one of the pair of nodes of all of the load dummy memory cell are connected to a around level so as to be fixed to a second status opposite to the first status.

2. A static memory:
   a memory cell array having a plurality of word lines, a plurality of bit line pairs, and memory cells, disposed at cross sections thereof, each having a pair of nodes which hold opposite levels;
   a dummy circuit disposed along the memory cell array, having a dummy word line, a dummy bit line, a plurality of self-timing dummy memory cells which are connected to the dummy word line and dummy bit line and have a pair of nodes holding opposite levels, and a plurality of load dummy memory cells connected to the dummy bit line pair, wherein said plurality of self-timing dummy memory cells drives the bit line together in response to a selection of dummy word line; and
   a timing control circuit for detecting a voltage chance of the dummy bit line to generate a timing control signal,
   wherein the pair of nodes of the self-timing dummy memory cells are fixed to a first status, and the pair of nodes of some of the load dummy memory cell are fixed to a second status opposite to the first status and the remaining ones are fixed to the same status as that of the self-timing dummy memory cells.

3. The static memory according to claim 1 or 2, wherein the timing control signal contains a starting signal for a sense amplifier which amplifies the bit line pair.

4. The static memory according to claim 1 or 2, wherein the static memory is of a clock synchronous type which inputs an address in synchronism with a clock to be supplied externally.

5. The static memory according to claim 1 or 2, wherein the load dummy memory cells are not selected during the readout operation.

6. The static memory according to claim 1 or 2, wherein the dummy memory cell includes a latch circuit in which I/O terminals of a pair of inverters are cross-connected to each other, the I/O terminals constitute the pair of nodes, and the pair of nodes are connected to the dummy bit line pair via a pair of transfer transistors.

7. The static memory according to claim 2, wherein one of the pair of nodes of the self-timing dummy memory cell is fixed to a first voltage level, and one of the pair of nodes of the load dummy memory cell is fixed to a second voltage level which is opposite to the first voltage level, or alternatively the other node is fixed to the first voltage level.

8. The static memory according to claim 7, wherein the first and second voltage levels are a power supply level or a ground level.

* * * * *